United States Patent
Takase et al.

[19]

[11] Patent Number: 6,051,508
[45] Date of Patent: Apr. 18, 2000

[54] MANUFACTURING METHOD OF SEMICONDUCTOR DEVICE

[75] Inventors: Tamao Takase, Yokohama; Tadashi Matsuno, Oita; Hideshi Miyajima, Yokohama, all of Japan

[73] Assignee: Kabushiki Kaisha Toshiba, Kawasaki, Japan

[21] Appl. No.: 09/145,464

[22] Filed: Sep. 2, 1998

[30] Foreign Application Priority Data

Sep. 9, 1997 [JP] Japan ................................. 9-244020

[51] Int. Cl.[7] ........................................... H01L 29/34
[52] U.S. Cl. ..................... 438/724; 438/744; 438/757; 438/791; 438/954; 257/640
[58] Field of Search .............................. 257/640; 438/724, 438/744, 757, 791, 954, 958, 454

[56] References Cited

U.S. PATENT DOCUMENTS

| | | | |
|---|---|---|---|
| 4,349,609 | 9/1982 | Takeda et al. | 428/429 |
| 4,493,855 | 1/1985 | Sachev et al. | 427/41 |
| 4,562,091 | 12/1985 | Sachev et al. | 427/41 |
| 4,599,243 | 7/1986 | Sachev et al. | 427/38 |
| 4,723,978 | 2/1988 | Clodgo et al. | 65/31 |
| 5,177,588 | 1/1993 | Ii et al. | 257/640 |

FOREIGN PATENT DOCUMENTS 4-262531  9/1992  Japan.
8-17928   1/1996  Japan.

*Primary Examiner*—Charles Bowers
*Assistant Examiner*—Laura M Schillinger
*Attorney, Agent, or Firm*—Finnegan, Henderson, Farabow, Garrett & Dunner, L.L.P.

[57] ABSTRACT

The present invention intends to form multilayer interconnects without deteriorating the advantage of an organosiloxane film (an interlayer dielectric), i.e., the low dielectric constant. According to the present invention, an organosiloxane film, a silicon nitride film, an inorganic SOG film, and a photoresist pattern are formed on a first metal layer, in series. The inorganic SOG film is then etched with use of the photoresist pattern as a mask to transfer the photoresist pattern to the inorganic SOG film. The photoresist pattern is then removed by oxygen plasma treatment with use of the silicon nitride film as a protection mask for protecting the organosiloxane film. Subsequently thereto, the silicon nitride film and the organosiloxane film are etched with use of the inorganic SOG film to form a contact hole reaching the first metal layer. After removing the inorganic SOG film, a second metal layer is formed to contact with the first metal layer through the contact hole.

9 Claims, 4 Drawing Sheets

MANUFACTURING METHOD OF SEMICONDUCTOR DEVICE

BACKGROUND OF THE INVENTION

This invention relates to a manufacturing method of a semiconductor device, in particular, a manufacturing method effective for forming multilayer interconnects, wherein an insulating film having a low resistance against oxygen plasma is used as an interlayer dielectric.

In accordance with the increase of the integration density of the LSI in recent years, the wiring layer of the LSI device has been decreased in size and increased in number. In addition to the downsizing and the multilayering of the wiring, the device with high performance is required to decrease the capacitance between the wirings when the device is formed fine in multilayered structure. In order to decrease the capacitance generated between the wirings, it is effective to use an interlayer dielectric having a low dielectric constant, for example.

As such an interlayer dielectric having low dielectric constant, an insulating film formed from siloxane and organic material have been proposed to be used instead of a silicon oxide film as the conventional interlayer dielectric. This type of an insulating film can be formed by the spin coating method, and thus is planarized without performing any planarization process such as the etch-back or the CMP (Chemical Mechanical Polishing). The multilayer structure can be therefore easily attained. In short, with use of such an interlayer dielectric, the reduction of the dielectric constant and the multilayering can be easily attained simultaneously.

The sectional views of the device according to the conventional method using an organosiloxane film as the low-dielectric constant interlayer dielectric are shown in FIGS. 1A, 1B, 1C, 1D, and 1E to explain each step of the manufacturing process.

As shown in FIG. 1A, a first metal layer 83 is formed above a silicon substrate 81 in which the element isolation and the element formation have been performed, so as to hold an insulating film 82 between itself and the substrate. An organosiloxane film 84 is then formed by the spin coating method on the insulating film 82 on which the first metal layer 83 is formed, as shown in FIG. 1A.

Next, as shown in FIG. 1B, a photoresist pattern 85 having an opening pattern above the first metal layer 83 is formed on the organosiloxane film 84.

The organosiloxane film 84 is then etched by the RIE method with use of the photoresist pattern 85 as a mask in order to form a contact hole reaching the first metal layer 83, as shown in FIG. 1C. The photoresist pattern 85 is removed with use of plasma thereafter (see FIG. 1D).

At last, a Ti/TiN barrier metal film 86 covering the sidewall and the bottom of the contact hole is formed as shown in FIG. 1E, and then a second metal layer 87 formed of Al added with Cu is formed by the sputtering to fill the contact hole. In this manner, a double-layered wiring structure is attained.

This wiring forming method, however, may cause the following problems:

The organosiloxane used as an insulating material having low dielectric constant has low resistance against oxygen plasma. Oxygen plasma used in the step shown in FIG. 1D to remove the photoresist pattern 85 thus may change the property of the organosiloxane film 84 to have high dielectric constant. The increase of the dielectric constant will increase the capacitance between the wirings, which may deteriorate the performance of the LSI device.

Further, the changed organosiloxane film 84 may corrode the first metal layer 83, the barrier metal film 86, and the second metal layer 87.

As one of effective methods of improving the resistance of an organosiloxane film against oxygen plasma, a surface treatment by oxygen ions has been known.

With use of this method, however, oxygen ions cannot reach the bottom of the contact hole since a contact hole of a fine LSI has a high aspect ratio, and thus the property of the side wall of the contact hole near the first wiring 83 cannot be completely improved.

If a too large amount of oxygen ions is deposited on the device in order that the oxygen ions can reach the bottom of the contact hole, the oxygen ions are implanted also into the first metal layer 83, thereby contact resistance between the first metal layer 83 and the second metal layer 87 will be increased.

In a dual damascene process wherein a contact hole and a wiring trench are simultaneously filled with a conductive film, the depth of the contact hole is increased by the depth of the wiring trench, and thus this problem caused by the improvement of the property of the surface of the film by the implantation of the oxygen ions will become more critical.

The above-mentioned problem will occur also in the case where an insulating film formed from organic material instead of siloxane is used as an interlayer dielectric having low dielectric constant.

As described above, it has been proposed in order to decrease the capacitance between the wirings to use an interlayer dielectric formed from siloxane or organic material having low dielectric constant.

Such a type of insulating film, however, has low resistance against oxygen plasma, and thus the property of the film may be changed by oxygen plasma used to remove the photoresist pattern formed thereon, to increase the dielectric constant of the film. The changed insulating film may corrode the metal layers formed near the interlayer dielectric.

BRIEF SUMMARY OF THE INVENTION

The present invention has been developed in consideration of the above problems, and intends to provide a manufacturing method of a semiconductor device, by which an interlayer dielectric is prevented from being adversely affected when a photoresist pattern formed on the insulating film to correspond to a contact hole and a wiring trench is removed.

The above-mentioned objects of the present invention are attained by a manufacturing method of a semiconductor device, comprises the steps of: forming a first insulating film on a base in which a first wiring layer is formed, so as to cover the first wiring layer, forming a second insulating film and a third insulating film on the first insulating film, in order, forming a first photoresist pattern on the third insulating film, selectively etching the third insulating film with use of the first photoresist pattern as a mask so as to transfer the first photoresist pattern to the third insulating film, wherein the second insulating film is used as an etching resistance mask for protecting the first insulating film from the etching, and removing the first photoresist pattern by using the second insulating film as a protection mask for protecting the first insulating film from damage (claim 1).

In order to form a second wiring layer through the contact hole, it is preferable to etch the second and the first insulating films in order, after the removing step of the first photoresist pattern, with use of the third insulating film as a mask (claim 2).

By another manufacturing method (claim 6) according to the present invention, further comprises the following steps: forming an opening reaching the first insulating film by etching the second insulating film with use of the third insulating film as a mask, after the removing step of the first photoresist pattern (claim 1), forming a fourth insulating film on the first and second insulating films so as to fill the opening, forming a fifth insulating film and a sixth insulating film on the fourth insulating film, in order, forming on the sixth insulating film a second photoresist pattern having an opening pattern corresponding to a wiring trench, selectively etching the sixth insulating film with use of the photoresist pattern as a mask so as to transfer the opening pattern of the second photoresist pattern to the sixth insulating film, wherein the fifth insulating film is used as an etching resistance mask for protecting the fourth insulating film from the etching, and removing the second photoresist pattern by using the fifth insulating film as a protection mask for protecting the fourth insulating film from damage.

In order to form a second wiring layer, it is preferable to form a wiring trench in the fourth insulating film by etching the fifth and fourth insulating films with use of the sixth insulating film as a mask to expose the second insulating film after the removing step of the second photoresist pattern, to form a contact hole reaching the first wiring layer by etching the fourth and the first insulating films in order, with use of the sixth insulating film and the exposed second insulating film as masks, and to form a second wiring layer to contact the first wiring layer through the wiring trench and the contact hole, after the sixth insulating film is removed (claim 7).

The first and fourth insulating films are preferably formed from an organic material having dielectric constant not more than 3.6 (organosiloxane, for example), and the second, third, fifth and sixth insulating films are preferably formed from an inorganic material (silicon nitride, inorganic SOG (silicon on glass), for example) (claims 3, 8).

By forming the insulating films from the materials as mentioned above, the third insulting film can be selectively etched to remain the first insulating film not etched, and the sixth insulting film can be selectively etched to remain the fourth insulating film not etched.

The second insulating film according to the present invention is preferably formed from a silicon nitride film, a carbon film, or the like.

The removals of the third and sixth insulting film are preferably performed with use of acid solution. By using the acid solution, the wiring layers respectively formed under the third and sixth insulting film can be prevented from being damaged by the removals.

The first wiring layer may be either a metal film formed in an insulating film or an impurity diffusion layer formed on the surface of the semiconductor substrate.

According to the present invention as mentioned above, the first insulating film is protected by the second insulating film when the first photoresist pattern which has an opening pattern corresponding to the wiring trench and is used in the etching of the third insulating film is removed, and thus the first insulating film is free from the influence of the removing step of the first photoresist pattern.

According to the present invention (claim 3), such an advantage as mentioned above can be also attained in the removing step of the second photoresist pattern having an opening pattern corresponding to the wiring trench and used in the etching of the sixth insulating film. In this case, the fourth insulating film is protected by the fifth insulating film and thus is prevented from being affected by the removing step of the second photoresist pattern.

The present invention is particularly effective in the case where the photoresist is removed with use of oxygen plasma as disclosed by the present invention (claim 6). According to the present invention, the dielectric constant of the first and fourth insulating films will not increase and the first and second wiring layers can be prevented from being corroded even if the first and fourth insulating films are formed from a film such as an organosiloxane which has low dielectric constant and low resistance against oxygen plasma.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Embodiments of the present invention will be described below with reference to the drawings.
[First Embodiment]

FIGS. 2A, 2B, 2C, 2D, 2E and 2F are sectional views of a semiconductor device, for showing a forming method of multilayer interconnects according to the first embodiment of the present invention. The first embodiment described below relates to the case where a double-layered wiring is formed according to the present invention.

Figure 1A:
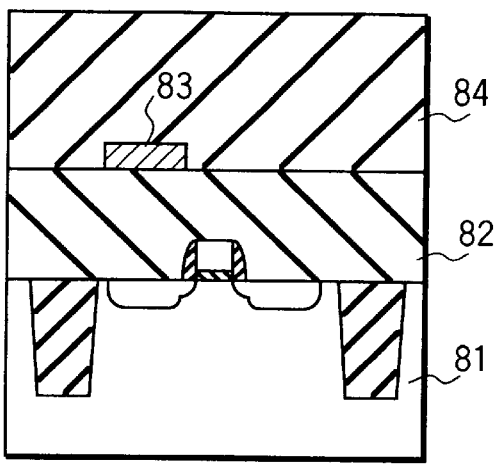
FIGS. 1A, 1B, 1C, 1D and 1E are sectional views of a semiconductor device, for showing the conventional forming method of multilayer interconnects.
Figure 1C:
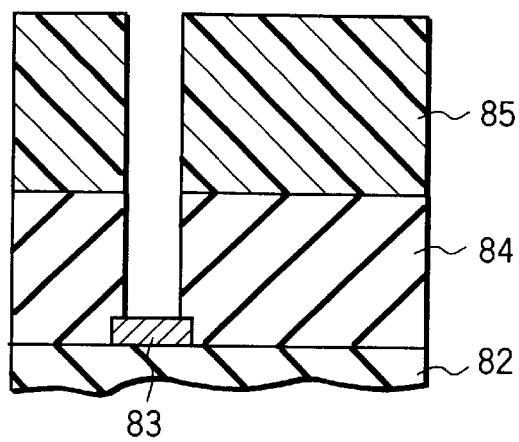
Figure 1D:
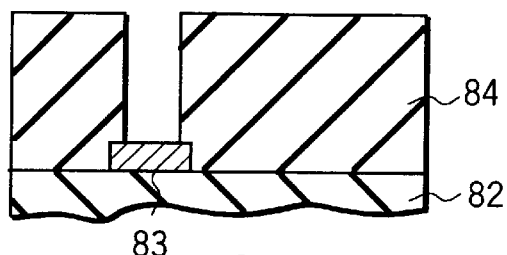
Figure 1B:
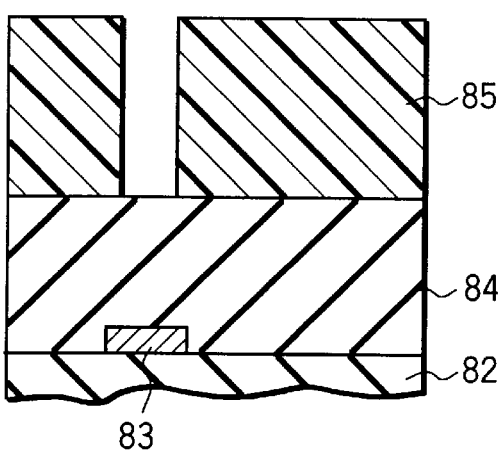
Figure 1E:
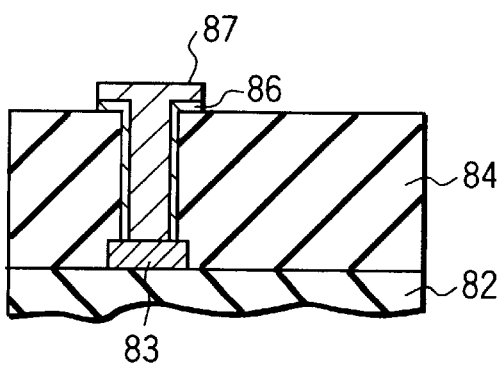
Figure 2A:
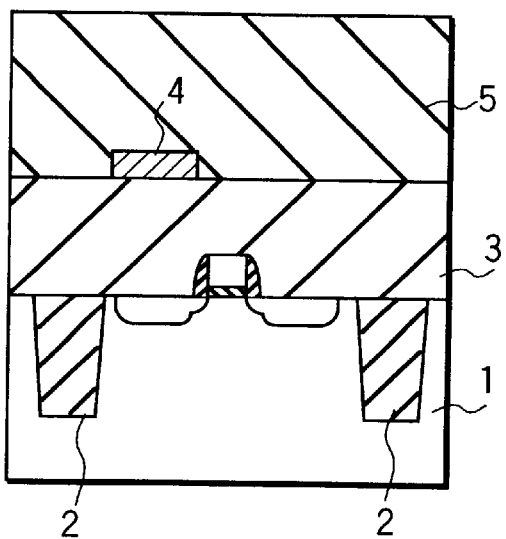
FIGS. 2A, 2B, 2C, 2D, 2E and 2F are sectional views of a semiconductor device, for showing a forming method of multilayer interconnects according to the first embodiment of the present invention.

As shown in FIG. 2A, an element is formed on a silicon substrate 1 at first. The element shown in FIG. 2A is a MOS transistor having the LDD (Lightly Doped Drain) structure. The element isolation is performed by the STI (Shallow Trench Isolation). In the drawing, 2 denotes an element isolation film.

After forming an interlayer dielectric 3 on the silicon substrate 1 in which the element is formed, a first metal layer 4 is formed on the interlayer dielectric 3, as shown in FIG.

2A. The first metal layer 4 is formed by processing a conductive film formed from Al or the like, according to the photolithography and the RIE.

Subsequently, as shown in FIG. 2A, an organosiloxane film 5 having a —CH$_3$ functional group and a thickness of 1 μm is formed by the spin coating on the interlayer dielectric 3 in which the first metal layer 4 is formed.

The organosiloxane film 5 is formed by the spin coating, and thus is plane without performing any process. Therefore, any planarization process such as the etch-back or the CMP needs not to be performed according to this embodiment of the present invention.

Figure 2D:
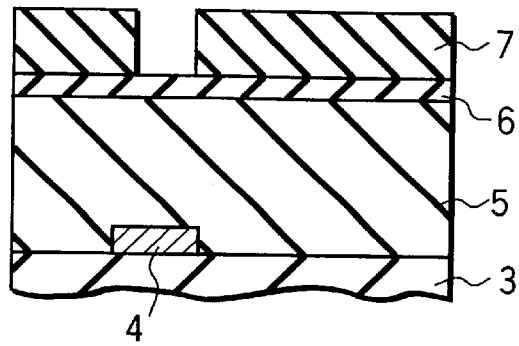
Figure 2B:
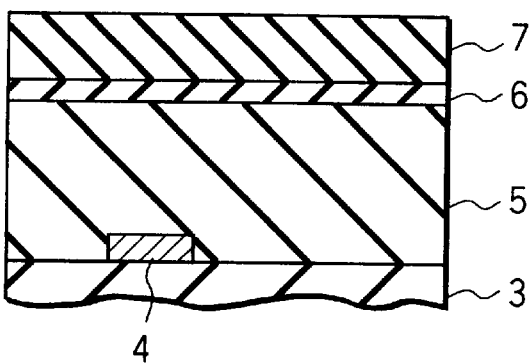

Next, as shown in FIG. 2B, a silicon nitride film 6 having a thickness of 20 nm is formed on the organosiloxane film 5 by the plasma CVD.

Subsequently, a siloxane film 7 which has Si—H bond but does not have an organic group (hereinafter referred to as "inorganic SOG (spin on glass) film") is formed on the silicon nitride film 6 by the spin coating, as shown in FIG. 2B. The inorganic SOG film 7 has a thickness of 300 nm. Similarly to the organosiloxane film 5, any planarization process needs not to be performed for the inorganic SOG film 7.

Figure 2E:
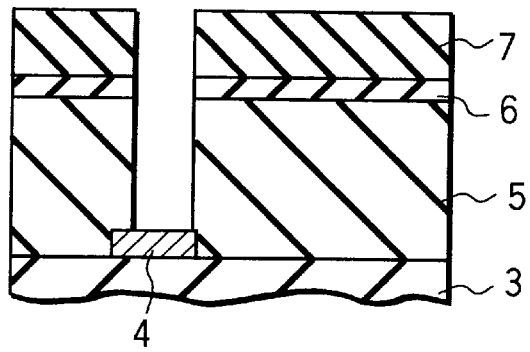
Figure 2C:
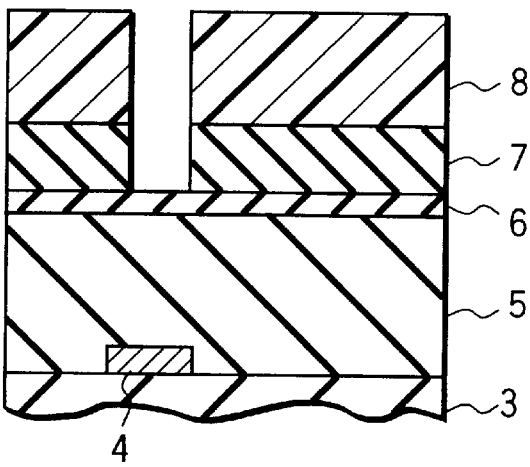

Thereafter, as shown in FIG. 2C, a photoresist pattern 8 having an opening pattern corresponding to a contact hole formed above the first metal layer 4 is formed by the photolithography.

The inorganic SOG film 7 is then etched by the RIE with use of the photoresist pattern 8 as a mask so as to transfer the photoresist pattern 8 to the inorganic SOG film 7, as shown in FIG. 2C. In this step, the etching is performed so as not to remove the silicon nitride film 6: to prevent the organosiloxane film 5 from being exposed.

Thereafter, the photoresist pattern 8 is removed by the oxygen plasma treatment (see FIG. 2D).

In this time, the organosiloxane film 5 is covered with the silicon nitride film 6 and thus is not exposed to the oxygen plasma. The property of the organosiloxane film 5 is thereby prevented from being changed by the oxygen plasma and the dielectric constant thereof will not increase. Therefore, the corrosion of a barrier metal layer or a second wiring layer which will be formed in the post process will be also prevented.

Next, as shown in FIG. 2E, the silicon nitride film 6 and the organosiloxane film 5 are serially etched by the RIE with use of the inorganic SOG film 7 as a mask, to form a contact hole reaching the first metal layer 4.

In this time, the RIE of the silicon nitride film 6 is performed under the condition determined such that the silicon nitride film 6 has sufficiently high etching selectivity with respect to the inorganic SOG film 7, and the RIE of the organosiloxane film 5 is performed under the condition determined such that the organosiloxane film 5 has sufficiently high etching selectivity with respect to the inorganic SOG film 7 or the silicon nitride film 6.

Subsequently, the inorganic SOG film 7 used as the mask is removed by the wet etching using a solution such as hydrofluoric acid (HF) or ammonium fluoride (NH$_4$F) as an etchant (see FIG. 2F).

The inorganic SOG film 7 is easily solved into the solution such as HF or NH$_4$F, while, the organosiloxane film 5 cannot be easily solved since the organic functional group of the organosiloxane film 5 has water repellency. Accordingly, the selective removal of the inorganic SOG film 7 can be easily attained in the wet etching.

In order to perform the selective removing without performing such a wet etching, the RIE condition may be determined such that the inorganic SOG film 7 is etched when the organosiloxane film 5 is etched, and disappears when the etching of the organosiloxane film 5 has finished. The inorganic SOG film 7 is formed thinner than the organosiloxane film 5, and thus such a selective removing process can be performed.

The inorganic SOG film 7 may disappear before the etching of the organosiloxane film 5 has finished, if the RIE condition is determined so that the organosiloxane film 5 has sufficiently high selective ratio with respect to the silicon nitride film 6.

Further, if the organosiloxane film 5 is subjected to the oxygen ion treatment or the like in advance in order to prevent the surface of the organosiloxane film 5 from being etched, the silicon nitride film 6 and the inorganic SOG film 7 can disappear at the time when the RIE of the organosiloxane film 5 has finished.

As described above, various methods may be applied to remove the inorganic SOG film 7, but the method using the wet etching is preferable among the methods in considering of the influence on the first metal layer 4.

Figure 2F:
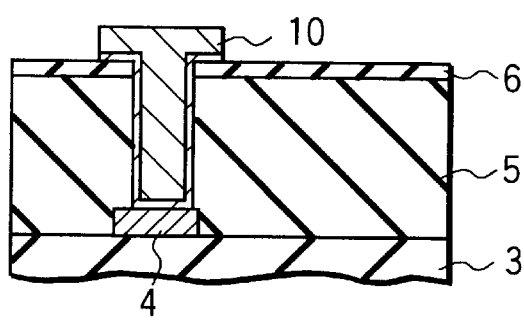

At the last of the process, a barrier metal film 9 is formed from a material such as Ti/TiN to cover the bottom and the side wall of the contact hole, and an Al film is then formed of Al added with Cu by the sputtering or the like, as shown in FIG. 2F. The Al film is processed by the photolithography and the RIE to form a second metal layer 10.

As described above, according to the present embodiment, the organosiloxane film 5 having low resistance against oxygen plasma is protected by the silicon nitride film 6 when the photoresist pattern 8 is removed by oxygen plasma treatment, so as to be free from the influence of oxygen plasma treatment. The low dielectric constant as an advantage of the organosiloxane film 5 can be prevented from increasing, and the multilayer interconnects having a small capacitance between the wirings can be attained thereby.

The present embodiment can be modified in various forms as will be described below.

For example, instead of the organosiloxane film having a —CH$_3$ group used in the present embodiment, an organic material having dielectric constant not more than 3.6 such as the organosiloxane film having an organic functional group other than a —CH$_3$ group, or an organic material film such as a polyimide, may be used.

In addition, the spin coating employed in the present embodiment to form the organosiloxane film 5 and the inorganic SOG film 7 may be replaced with the other methods such as the CVD, the sputtering, or the like.

Further, instead of the inorganic SOG film 7 used as an insulating film in the present embodiment, any insulating film having resistance against oxygen plasma can be used: a silicon oxide film formed by the plasma CVD or the like; a silicon oxide film having a bond such as Si—C, Si—F, or Si—B, or the like.

Additionally, the silicon nitride film 6 used in the present embodiment may be replaced with any insulating film such as a carbon film, which has the resistance against oxygen plasma and high etching selectivity with respect to the inorganic SOG film 5 formed below the silicon nitride film 6.

Further, the silicon nitride film 6 is left to form the second metal layer 10 in the present embodiment, but may be removed to form the second metal layer 10. In this case, the capacitance between the wirings can be further decreased in comparing the above-mentioned case.

Although Al added with Cu is used as wiring metal material in this embodiment, other metals such as W, Cu, Ag and so on can be used. Although Ti/TiN is used as a barrier metal material in this embodiment, other barrier metal materials can be used. Although the example of opening a contact hole is shown, a wiring trench can be opened in the place of a contact hole. Although single layer formation of organosiloxane film 5 is described in this embodiment for example, a multilayered insulating film partially having organosiloxane and silicon nitride can be formed, in order to prevent unequal etching depth of wiring trenches in the case of dual damascene wiring.

Although the double-layered wiring has been described in the present embodiment, the multilayer interconnects having more than two wiring layers can be obtained by repeating the metal layer forming process of the present embodiment.

[Second Embodiment]

FIGS. 3A, 3B, 3C, 3D, 3E, 3F, and 3G are sectional views of a semiconductor device, for showing a forming method of multilayer interconnects according to the second embodiment of the present invention. In this embodiment, the present invention is applied to the dual damascene process.

Figure 3A:
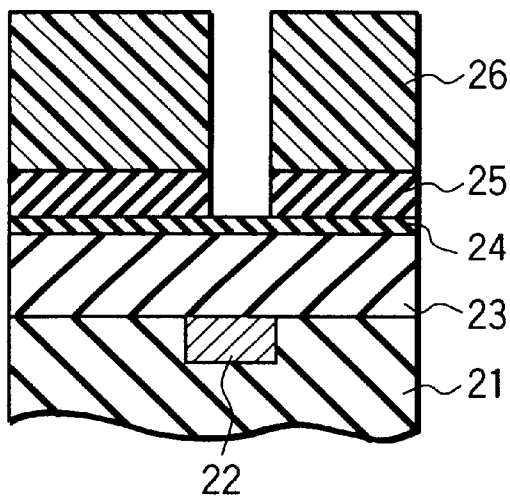
FIGS. 3A, 3B, 3C, and 3D are sectional views of a semiconductor device, for showing the first half of a forming method of multilayer interconnects according to the second embodiment of the present invention.

As shown in FIG. 3A, after a first wiring trench is formed on the surface of an interlayer dielectric 21, a first metal layer 22 is formed in the first wiring trench by inlaying the wiring therein.

A silicon substrate in which elements are formed is exist under the interlayer dielectric 21, in fact, but omitted from the drawings. After forming the first metal layer 22, an organosiloxane film 23 having a —CH$_3$ group and a thickness of 500 nm is formed by the spin coating on the interlayer dielectric 21 in which the first metal layer 22 is formed as shown in FIG. 3A. Then, a silicon nitride film 24 having a thickness of 20 nm is formed on the organosiloxane film 23 by the plasma CVD.

Next, as also shown in FIG. 3A, after an inorganic SOG film 25 having a Si—H bond and a thickness of 300 nm is formed on the silicon nitride film 24 by the spin coating, a photoresist pattern 26 having an opening pattern corresponding to a contact hole is formed on the inorganic SOG film 25 by the photolithography.

Thereafter, the inorganic SOG film 25 is etched by the RIE with use of the photoresist pattern 26 as a mask, as shown in FIG. 3A, to transfer the pattern of the photoresist pattern 26 to the inorganic SOG film 25. In this step, the etching is performed so as not to remove the silicon nitride film 24 such that the organosiloxane film 23 is not exposed.

Subsequently, the photoresist pattern 26 is removed by the oxygen plasma treatment. In this time, the organosiloxane film 23 is covered with the silicon nitride film 24 and thus is not exposed to the oxygen plasma. By covering the organosiloxane film 23 in this manner, the property of the organosiloxane film 23 remains not changed by the oxygen plasma, and the dielectric constant of the organosiloxane film 23 will never be increased. Further, since the property of the organosiloxane film 23 is not changed, a barrier metal film and a second metal layer formed in the post process can be prevented from being corroded by the organosiloxane film 23.

Figure 3B:
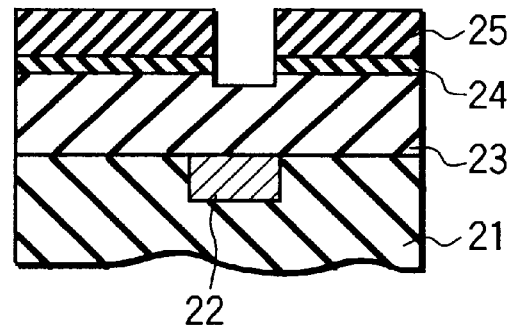

Next, as shown in FIG. 3B, the silicon nitride film 24 is etched by the RIE with use of the inorganic SOG film 25 as a mask. The RIE is performed such that the silicon nitride film has sufficiently high etching selectivity with respect to the inorganic SOG film 25. FIG. 3B shows the organosiloxane film 23 is etched together with the inorganic SOG film 25 and the silicon nitride film 24, but the organosiloxane film 23 needs not to be etched necessarily.

Figure 3C:
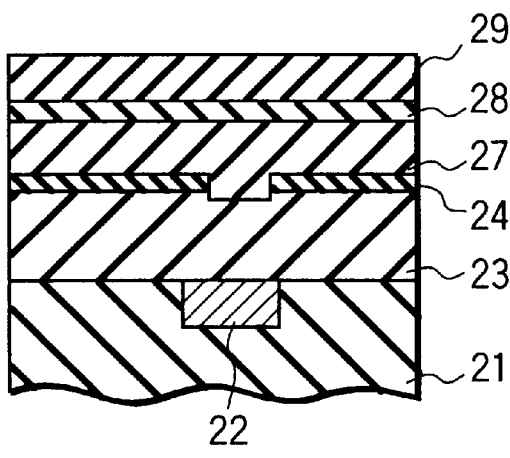

Subsequently, as shown in FIG. 3C, the inorganic SOG film 25 is removed by the similar method to that used in the step of the first embodiment, which is shown in FIG. 2D. The etching is performed so as not to remove the silicon nitride film 24.

Next, an organosiloxane film 27 is formed to have a thickness of 400 nm by the spin coating as shown in FIG. 3C. Subsequently thereto, a silicon nitride film 28 of 200 nm thick is formed on the organosiloxane film 27 by the plasma CVD, and then an inorganic SOG film 29 is formed to have a thickness of 300 nm on the silicon nitride film 28 by the spin coating.

Figure 3D:
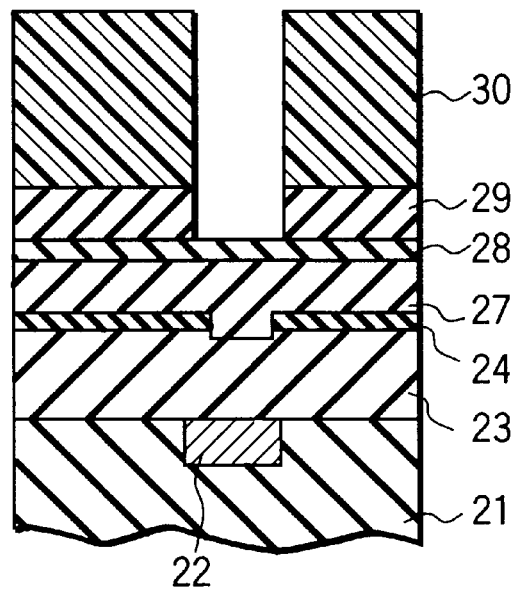

Thereafter, after a photoresist pattern 30 having an opening pattern corresponding to the wiring trench is formed on the inorganic SOG film 29 as shown in FIG. 3D, the inorganic SOG film 29 is etched by the RIE with use of the photoresist pattern 30 as a mask to transfer the photoresist pattern 30 to the inorganic SOG film 29.

Figure 3E:
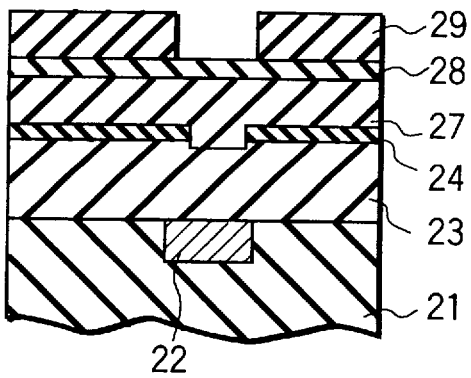
FIGS. 3E, 3F, and 3G are sectional views of a semiconductor device, for showing the second half of a forming method of multilayer interconnects according to the second embodiment of the present invention.

Subsequently thereto, the photoresist pattern 30 is removed by the oxygen plasma treatment (see FIG. 3E).

During the removing of the photoresist pattern 30, the organosiloxane film 27 is covered with the silicon nitride film 28 so as not to be exposed to the oxygen plasma. The property of the organosiloxane film 27 thus is not changed by the oxygen plasma, and the dielectric constant thereof will not be increased. Further, a barrier metal layer and a second metal layer formed in the post process can be prevented from being corroded by the organosiloxane film.

Figure 3F:
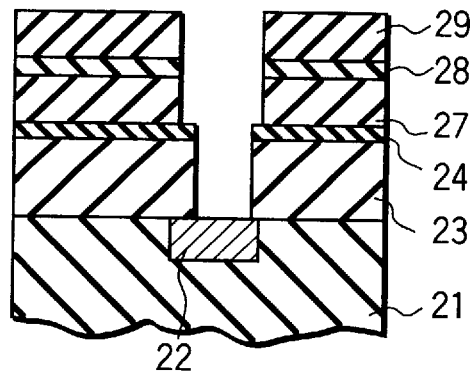

Next, as shown in FIG. 3F, the RIE etching of the silicon nitride film 28 and the organosiloxane film 27 is performed in order, with use of the inorganic SOG film 29 as a mask till the surface of the silicon nitride film 24 is exposed, in order to form a wiring trench in the organosiloxane film 27.

The organosiloxane film 23 is then etched as shown in FIG. 3F, by the RIE with use of the inorganic SOG film 29 and the exposed silicon nitride film 24 as a mask such that the silicon nitride film 24 is not removed, to form a contact hole reaching the first metal layer 22. The wiring trench in the organosiloxane film 27 is connected to the first metal layer 22 through the contact hole.

Subsequently thereto, the inorganic SOG film 29 is removed by the wet etching with use of a solution of HF, NH$_4$F, or the like.

Figure 3G:
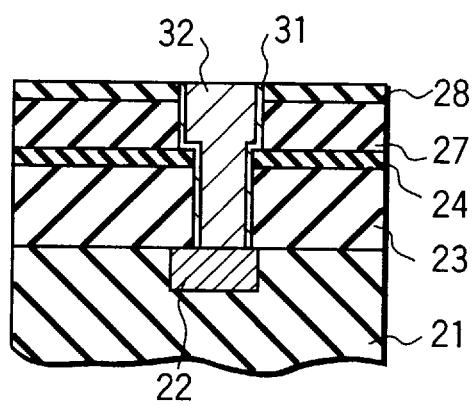

Next, after a barrier metal film 31 is formed from a material such as Ti/TiN so as to cover the bottom and the side wall of the contact hole and wiring trench, an Al film formed of Al added with Cu is formed thereon by the sputtering or the like as shown in FIG. 3G. The Al film is processed by the CMP to obtain the second metal layer 32.

As described above, according to the present embodiment, when the photoresist patterns 26 and 30 are removed by the oxygen plasma, the organosiloxane films 23 and 27 having low resistance against the oxygen plasma are protected respectively by the silicon nitride films 24 and 28 to be protected from the influence of the oxygen plasma. Therefore, the advantage of the organosiloxane films 23 and 27, i.e., the low dielectric constant, can be enjoyed sufficiently, to realize a dual damascene wiring having a low capacitance between wirings.

Further, though the silicon nitride film 28 is left to form the second metal layer 32 in the present embodiment, the second metal layer may be formed after the silicon nitride film 28 is removed. According to the latter method, the capacitance between the wirings can be further reduced.

This embodiment can be also modified in various forms as described in the first embodiment.

Further, the present invention is not limited to the embodiments described above. For example, the first wiring layer is formed of metal in the above-mentioned embodiments, but the present invention can be applied to the case where the first wiring layer is an impurity diffusion layer formed on the surface of a silicon substrate. The other changes and modifications may be also effected therein without departing from the scope or spirit of the invention.

As has been described above in detail, according to the present invention, the first insulating film is protected by the second insulating film when the first photoresist pattern used to etch the third insulating film is removed, and thus the first insulating film can be prevented from being affected by the removing step of the first photoresist pattern.

In this manner, according to the present invention, even if the first photoresist pattern is removed with use of oxygen plasma when the first insulating film is formed of a film having low dielectric constant and low resistance against oxygen plasma, the increase of the dielectric constant of the first insulating film will not occur, and/or the first wiring layer can be prevented from being corroded by the first insulating film.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method of a semiconductor device, comprising the steps of:

forming a first insulating film above a base in which a first wiring layer is formed, so as to cover the first wiring layer, forming a second insulating film and a third insulating film on the first insulating film, in order, forming a first photoresist pattern on the third insulating film, selectively etching the third insulating film with use of the first photoresist pattern as a mask so as to transfer the first photoresist pattern to the third insulating film, wherein the second insulating film is used as an etching resistance mask for protecting the first insulating film from the etching, and removing the first photoresist pattern by using the second insulating film as a protection mask for protecting the first insulating film from damage.

2. A manufacturing method according to claim 1, further comprising the steps of:

etching the second and the first insulating films in order, after the removing step of the first photoresist pattern, with use of the third insulating film as a mask.

3. A manufacturing method according to claim 1, wherein the first insulating film is formed from an organic material having dielectric constant not more than 3.6, and the second and third insulating films are formed from an inorganic material.

4. A manufacturing method according to claim 1, wherein the first photoresist pattern is removed by using oxygen plasma.

5. A manufacturing method according to claim 2, wherein, after etching the second and first insulating film, the second wiring layer is formed after the second insulating film is removed.

6. A manufacturing method according to claim 1, further comprising the steps of:

forming an opening reaching the first insulating film by etching the second insulating film with use of the third insulating film as a mask, after the removing step of the first photoresist pattern, forming a fourth insulating film on the first and second insulating films so as to fill the opening, forming a fifth insulating film and a sixth insulating film on the fourth insulating film, in order, forming on the sixth insulating film a second photoresist pattern having an opening pattern corresponding to a wiring trench, selectively etching the sixth insulating film with use of the photoresist pattern as a mask so as to transfer the second photoresist pattern to the sixth insulating film, wherein the fifth insulating film is used as an etching resistance mask for protecting the fourth insulating film from the etching, and removing the second photoresist pattern by using the fifth insulating film as a protection mask for protecting the fourth insulating film from damage.

7. A manufacturing method according to claim 6, further comprising the steps of:

forming a wiring trench in the fourth insulating film by etching the fifth and fourth insulating films with use of the sixth insulating film as a mask to expose the second insulating film after the removing step of the second photoresist pattern, forming a contact hole reaching the first wiring layer by etching the fourth and the first insulating films in order, with use of the sixth insulating film and the exposed second insulating film as masks, and forming a second wiring layer to contact the first wiring layer through the wiring trench and the contact hole, after the sixth insulating film is removed.

8. A manufacturing method according to claim 6, wherein the first and fourth insulating films are formed from an organic material having dielectric constant not more than 3.6, and the second, third, fifth, and sixth insulating films are formed from an inorganic material.

9. A manufacturing method according to claim 7, wherein, after removing the sixth insulating film, the second wiring layer is formed after the fifth insulating film is removed.

* * * * *